(12) United States Patent
Davidson et al.

(10) Patent No.: US 6,297,967 B1
(45) Date of Patent: Oct. 2, 2001

(54) SELF-SECURING RF SCREENED HOUSING

(75) Inventors: Brian James Davidson, Woking Surrey (GB); Rainer Weber, Waldbronn (DE)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/017,824

(22) Filed: Feb. 3, 1998

(30) Foreign Application Priority Data

Feb. 5, 1997 (GB) .................................................. 9702345

(51) Int. Cl.[7] .................................................. H05K 7/14
(52) U.S. Cl. .................. 361/800; 361/816; 361/818; 361/736; 361/759; 174/35 R; 206/719
(58) Field of Search .................. 361/765, 759, 361/800, 816, 818, 736, 737; 174/35 R; 206/719

(56) References Cited

U.S. PATENT DOCUMENTS

| | | | |
|---|---|---|---|
| 4,370,315 | * | 1/1983 | Donaldson .......................... 174/35 R |
| 4,754,101 | * | 6/1988 | Stickney et al. .................... 174/35 R |
| 4,759,466 | * | 7/1988 | Chase et al. .......................... 220/306 |
| 4,912,602 | * | 3/1990 | Zurek et al. ........................... 361/399 |
| 4,912,604 | | 3/1990 | Vaisanen .............................. 361/424 |
| 4,945,633 | | 8/1990 | Hakanen et al. ....................... 29/825 |
| 4,948,923 | * | 8/1990 | Suzuki ................................ 174/35 R |
| 5,006,667 | | 4/1991 | Lonka ................................. 174/35 R |
| 5,175,395 | * | 12/1992 | Moore ................................ 174/35 R |
| 5,365,410 | | 11/1994 | Lonka ................................... 361/816 |
| 5,400,949 | | 3/1995 | Hirvonen et al. ............... 228/180.22 |
| 5,436,802 | * | 7/1995 | Trahan et al. ........................ 361/816 |
| 5,442,521 | | 8/1995 | Hirvonen et al. ..................... 361/800 |
| 5,603,103 | | 2/1997 | Halttunen et al. ..................... 455/90 |
| 5,687,470 | | 11/1997 | Halttunen et al. .................. 29/592.1 |
| 5,774,344 | * | 6/1998 | Casebolt ............................... 361/800 |
| 5,883,791 | * | 3/1999 | Deguchi ............................... 361/818 |
| 5,895,884 | * | 4/1999 | Davidson ........................... 174/35 R |

FOREIGN PATENT DOCUMENTS 2 212 000 A    7/1989 (GB) .

\* cited by examiner

*Primary Examiner*—Jeffrey Gaffin
*Assistant Examiner*—Tuan Dinh
(74) *Attorney, Agent, or Firm*—Perman & Green, LLP

(57) ABSTRACT

An RF screened housing (1;13) according to the invention contains a screening plate (2;15) and having at least two mutually opposite side walls (3;16), which project from said screening plate (2;15) and are designed to engage behind rims of a printed circuit board (5;14), which is fitted with the RF screened housing (1;13), as well as elastic means (7;18) which can be pressed against at least one of the main surfaces of the printed circuit board (5;14) in order to clamp them at the rims to the side walls (3;16).

14 Claims, 4 Drawing Sheets

SELF-SECURING RF SCREENED HOUSING

BACKGROUND OF THE INVENTION

The invention relates to a self-securing RF screened housing for screening against electromagnetic radiation.

In the case of screening devices, a problem which arises frequently is to produce between a printed circuit board and a screened housing connected to it a contact which is sufficient for RF screening. This is particularly problematic if a unit in which the RF screening device is used is subject to vibration, which may be the case, for example, when used in a vehicle. For this reason, a conductive foam (or adhesive) is generally used in order to ensure a reliable contact between the printed circuit board and the screening device. The use of such an additional aid is, however, on the one hand very expensive and, on the other hand, a further process step is required during assembly, as a result of which the production and assembly time is unnecessarily extended.

Furthermore, dismantling of such RF screening devices for repair work is complex, since the conductive foam or adhesive as a rule has to be removed first and must then be replaced by new foam or adhesive.

SUMMARY OF THE INVENTION

In accordance with the invention there is provided self-securing RF screened housing having a screening plate and having at least two mutually opposite side walls, which project from said screening plate and are designed to engage behind rims of a printed circuit board, which is fitted with the RF screened housing, and having elastic means which can be pressed against at least one of the main surfaces of the printed circuit board in order to clamp the latter at the rims to the side walls. The invention provides an RF screened housing which enables reliable and RF-proof electrical contact with a printed circuit board in a relatively simple manner, to be precise even when subject to relatively long-lasting and severe vibration stresses.

If the RF screened housing, which may be completely composed of electrically conductive material or, for example, of plastic with an electrically conductive coating, is placed onto the printed circuit board, its side walls come into contact with electrically conductive regions on the printed circuit board. As a result of the contact pressure produced by the elastic means, a reliable screen is obtained in this case, since said means always ensure the electrical contact, even when subject to relatively severe mechanical stresses.

The elastic means may likewise expediently be electrically conductive, so that it is possible to produce an even better electrical contact between the RF screened housing and the printed circuit board. When the RF screened housing is placed onto the printed circuit board, the elastic means then press against the conductive coating, which is applied on the surface of the printed circuit board, and thus further improve the screening reliability.

According to an advantageous development of the invention, the side walls have openings, which are located at a distance from one another in the longitudinal direction of said side walls, for holding tabs which project at the sides from the printed circuit board.

When the RF screened housing is placed onto the printed circuit board, the side walls, which project from the screening plate, initially bend outwards, before then springing back again into their original position allowing the tabs, which are fitted on the printed circuit board at a distance corresponding to that between the openings and the side walls, to snap into these openings.

The electrically conductive inner edges of the openings are in this case electrically conductively connected to the rest of the RF screened housing, so that, when the RF screened housing is coupled to the printed circuit board, a good electrical contact is produced between at least one electrically conductive inner edge of each opening and an electrical coating which is formed on the printed circuit board. The last-mentioned electrical coating may also be present on both sides of the printed circuit board and of the tabs.

The RF screened housing is effectively protected against sliding off as a result of the fact that the tabs, which are fitted on the printed circuit board at the sides, snap into the openings in the side walls.

According to another advantageous development of the invention, the elastic means, which are designed as lugs, project into each of the openings, it being possible for the lugs to be, for example, integrally connected to the side wall, for example at the lower inner edge, which is parallel to the screening plate, of the openings. In consequence, a reliable electrical contact is produced between the RF screened housing and the printed circuit board, since the conductive coating on the upper surfaces of the tabs which are fitted to the printed circuit board is now pressed by the elastic lugs against the upper inner edges, which are parallel to the screening plate, of the openings. Alternatively, an electrical contact can be made via the lugs, which press against electrically conductive regions on the side of the printed circuit board facing them.

It would furthermore be conceivable for the elastic means, which are designed as lugs, to be connected to the side wall on any other inner edges of the openings, the tabs always being pressed against those inner edges of the openings which are opposite the lugs.

Alternatively, a plurality of elastic means, which are designed as lugs, can also project into the openings in the side walls, this still further improving the coupling of the printed circuit board to the RF screened housing.

According to an advantageous development of the invention, the screening plate, the elastic means which are designed as lugs, and the side walls may be formed from a single metal sheet, which has a positive effect on the production costs and the production time.

In a further refinement of the invention, the elastic means, which are designed as lugs, are bent outwards relative to the side wall, which makes it easier to fit the RF screened housing onto the printed circuit board, since the side walls can then spring back over the tabs better.

The elastic means, which are designed as lugs, may, however, themselves also be bent inwards or run in a straight line parallel to the side wall.

According to yet another development of the invention, the side walls are bent outwards in the region of their free rim in order thus to make it easier to fit the RF screened housing onto the printed circuit board without there being any risk of the electrically conductive coating, which is present on the tabs, being scratched during the fitting operation.

According to another highly advantageous development of the invention, the mutually opposite side walls have wall regions which are at a distance from one another in the longitudinal direction of the printed circuit board and run inwards, for engaging behind the rims of said printed circuit board. These wall regions which run inwards may be formed by pressing in the side walls in place.

Alternatively, the wall regions which run inwards may, however, also be formed by cutting and bending the side walls in places.

When the RF screened housing is fitted onto the printed circuit board, the side walls in turn bend outwards in order then to spring back in essence to their original position once the wall regions which run inwards have passed the rim of the printed circuit board. The advantage of this development is that the printed circuit board does not need to be additionally processed, since there is no need for any tabs, which project from the printed circuit board at the sides, or similar structures on the printed circuit board and, nevertheless, a good electrically conductive contact is produced between the RF screened housing and the printed circuit board as a result of the effect of the elastic means, which press the printed circuit board against the wall regions which run inwards. In this case the elastic means press the printed circuit board away from the screening plate and against the wall region which run inwards. Since the wall regions which run inwards and, expediently, the elastic means as well are electrically conductive, a good electrical contact is ensured with an electrically conductive coating on the top and/or bottom of the printed circuit board.

According to another development, the elastic means are advantageously formed by lugs which are composed of parts of the screening plate and/or of the side walls. In consequence, the production of the elastic means can be integrated into the production sequence in a simple manner.

Alternatively, however, the elastic means could also be manufactured separately, in order then to be fitted subsequently. Other refinements of the elastic means are not precluded.

According to a refinement of the invention, further side walls are located in the region between the said side walls, on the free edges of which further side walls there are further electrically conductive, elastic means for pressing the printed circuit board away from the screening plate. This further improves the electrical contact between the RF screened housing and the electrically conductive coating on the printed circuit board, and this also applies to the level of screening in the respective circumferential regions of the screening plate.

BRIEF DESCRIPTION OF THE DRAWINGS

Exemplary embodiments of the invention will be described in more detail in the following text, with reference to the attached drawings, in which.

DETAILED DESCRIPTION OF THE INVENTION

Figure 1:
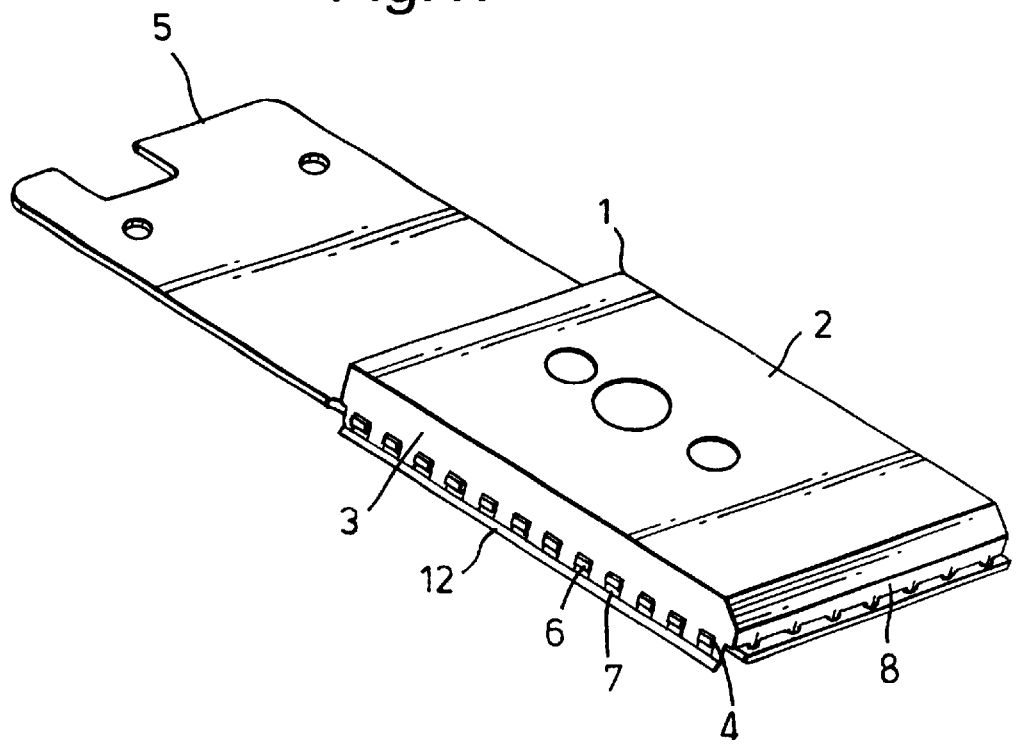
FIG. 1 shows a first exemplary embodiment of an RF screened housing according to the invention, which is fitted onto a printed circuit board.
Figure 3:
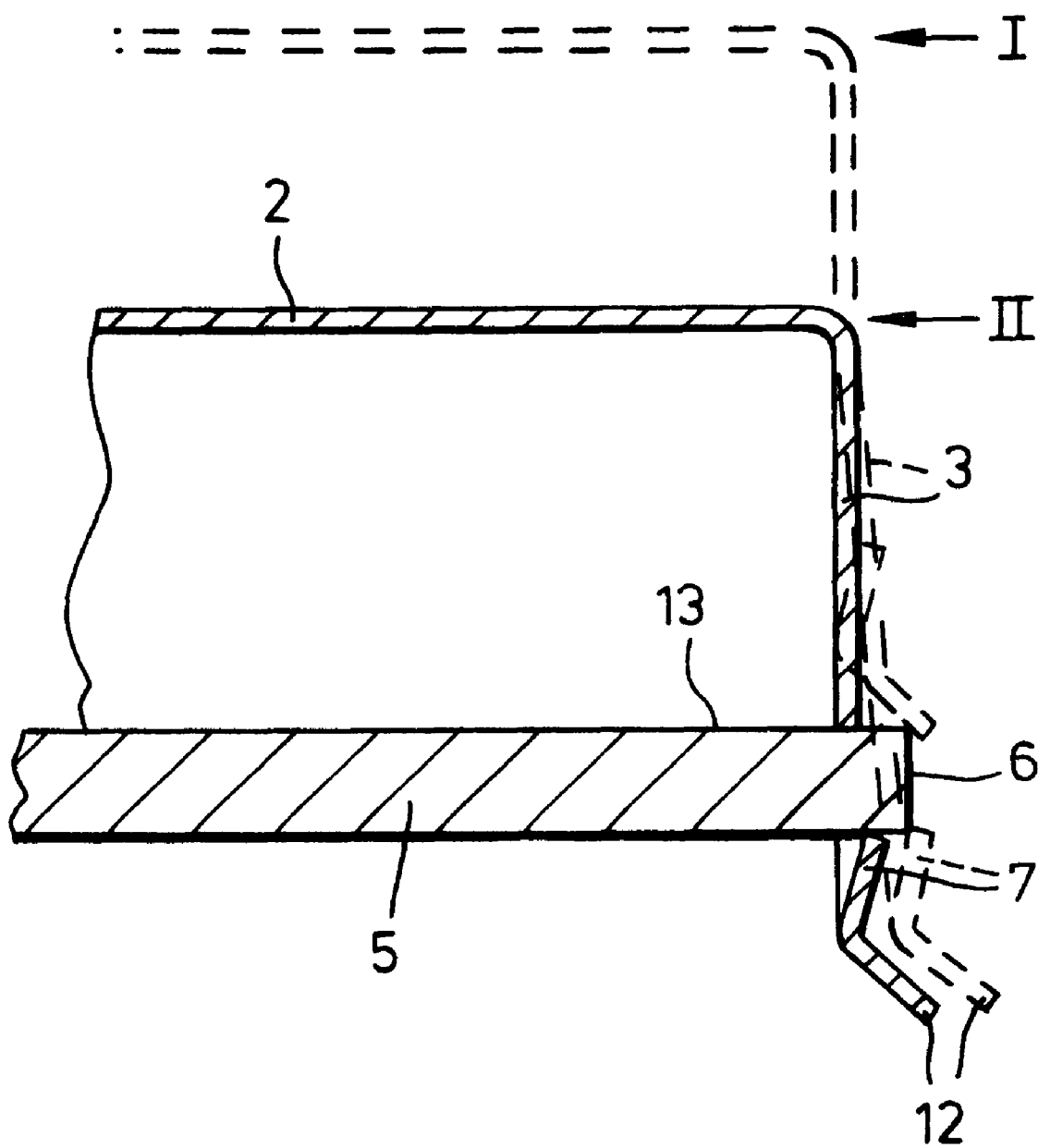
FIG. 3 shows a section transversely with respect to the longitudinal direction of the printed circuit board, with the RF screened housing from FIG. 2 fitted, and shortly before fitting.

FIG. 1 shows an advantageous embodiment of an RF screened housing according to the invention, a cross-section of which is shown, enlarged, in FIG. 3. This housing is produced from appropriately shaped sheet metal.

The RF screened housing is designated by the reference number 1 and in essence comprises a flat screening plate 2 on opposite edges of which side walls 3 are flexibly fitted, which are integrally connected to the screening plate 2. Openings 4, which can hold tabs 6, which project from a printed circuit board 5 at the sides, such that they are clamped, are located at a distance from one another in the longitudinal direction of the side walls 3, on the lower rim region of said side walls 3.

In FIG. 1, the RF screened housing 1 is fitted onto the printed circuit board 5, which is provided on its two main surfaces with an electrically conductive coating, which receives the screen potential. An electrically conductive contact is produced between the electrically conductive upper and/or lower inner edge, which is parallel to the screening plate 2, of each opening 4 and the corresponding tab 6, which in each case projects from the printed circuit board 5 at the sides.

Figure 2:
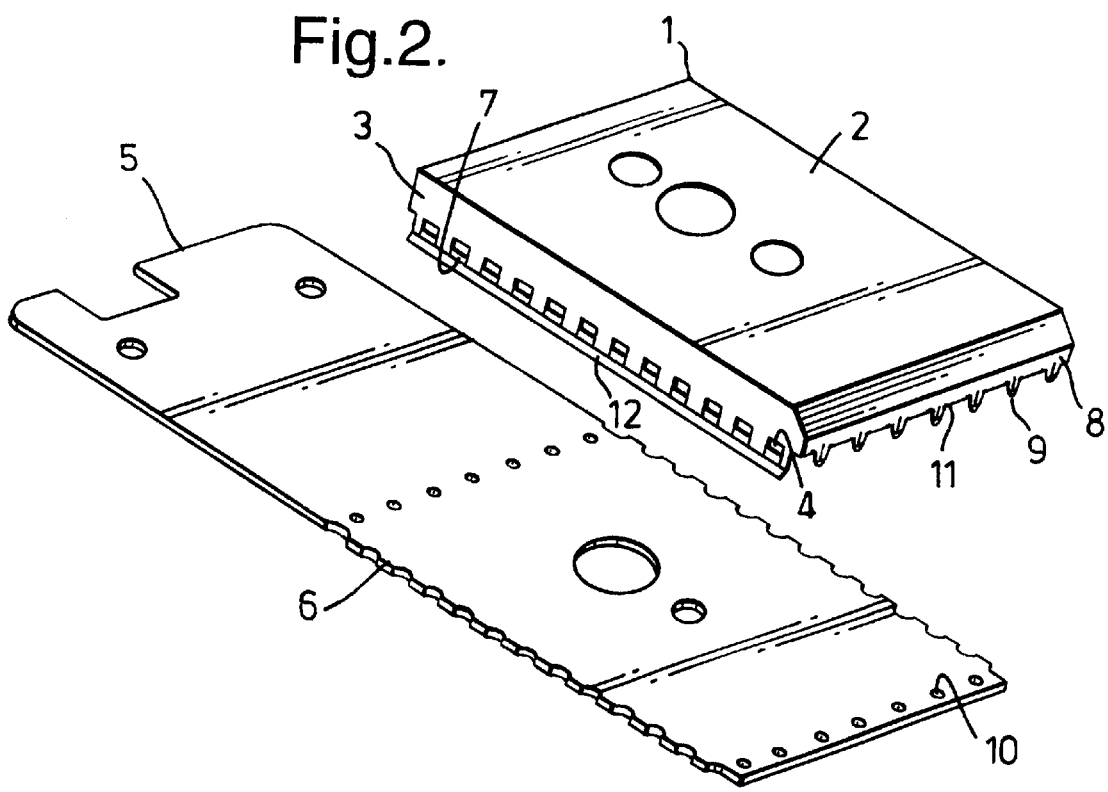
FIG. 2 shows the printed circuit board and the RF screened housing from FIG. 1, separated.

FIG. 2 shows the RF screened housing 1 and the printed circuit board 5 separated from one another. It can be seen that the elastic means are designed as sprung lugs 7 and project into the openings 4 from the lower inner edge, which is parallel to the screening plate 2, of each opening 4 in the side walls 3, each lug 7 being elastically and integrally connected to the side wall 3.

The sprung lugs 7 are expediently bent outwards relative to the side wall 3, in order to make it easier for the side walls 3 to spring back onto the tabs 6. Furthermore, the sprung lugs 7 produce contact pressure between the RF screened housing 1 and the tabs 6, which project from the printed circuit board 5 at the sides and are covered with the conductive coating. The tabs 6 are in this case electrically conductively coated on the top and bottom.

FIG. 2 furthermore shows tabs 9, which are constructed on the other side walls 8 of the RF screened housing, are arranged at a distance from one another and extend substantially at right angles to the screening plate 2, in the direction of the printed circuit board 5. These tabs 9 are designed in such a manner that they have a gap which extends centrally in the longitudinal direction so that, when the tabs 9 are inserted into corresponding holes 10 in the printed circuit board 5, the tabs 9 flex in a spring manner in order additionally to ensure a firm coupling to the printed circuit board 5 by clamping in the holes 10. The tabs 9 are integrally connected to the other side walls 8 and are likewise composed of conductive material.

The function of the tabs 9 is, on the one hand, additional fixing of the RF screened housing 1 on the printed circuit board 5 by the tabs 9 being clamped into corresponding holes 10 in the printed circuit board 5 and, on the other hand, the production of a reliable electrical contact between the RF screened housing 1 and the printed circuit board 5, via these tabs 9 and their edges, which make contact in their upper region with the electrically conductive coating on the upper side of the printed circuit board 5.

Edges 11, which are located between the tabs 9, of the other side walls 8 are likewise in contact with the electrically conductive coating on the printed circuit board 5.

FIG. 2 also shows that the free edges of the sprung side walls 3 are bent outwards in the lower region 12, which makes it easier to fit the RF screened housing 1 onto the printed circuit board 5.

FIG. 3 shows a cross-section through the RF screened housing 1 and the printed circuit board 5, the process of fitting the RF screened housing 1 onto the printed circuit board 5 being clarified by illustrating two states.

The state I (illustrated by dashed lines) shows the RF screened housing 1 shortly before being fitted onto the printed circuit board 5. By pressing the RF screened housing 1 down in the direction of the printed circuit board 5, the flexible side walls 3 are bent outwards, which is assisted by the region 12, which is bent outwards, on the free edge of the flexible side wall 3. After the RF screened housing 1 has been pressed further downwards in the direction of the printed circuit board 5, the side walls 3 spring back into their original position since the tabs 6, which project from the printed circuit board 5 at the sides, move into the openings 4 as soon as the sprung lugs 7 have passed the lower edges of the tabs 6 (state II). The sprung lugs 7, which are bent outwards in the exemplary embodiment, thus press the upper surface 13 of the tabs 6 against the upper inner edge of the openings 4, which upper inner edge is closer to the screening plate 2 and is parallel to the latter, as a result of which a good electrically conductive contact is produced between the conductive coating on the upper and/or lower surface of the tabs 6 and the upper and/or lower inner edge of the openings 4, which inner edge is parallel to the screening plate 2.

Figure 4:
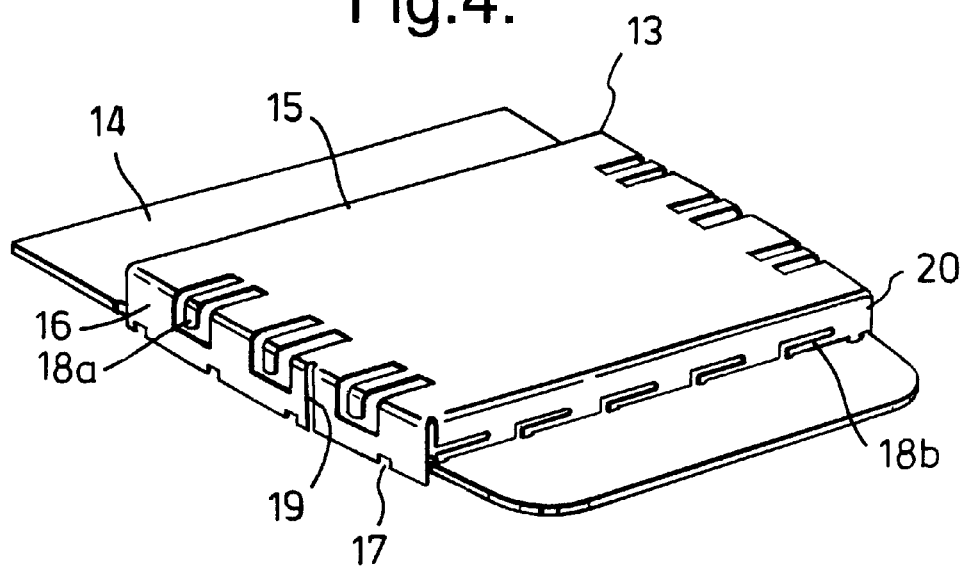
FIG. 4 shows a second exemplary embodiment of an RF screened housing according to the invention, fitted on a printed circuit board.

FIG. 4 shows a second exemplary embodiment of the invention, in which an RF screened housing 13 is fitted onto a printed circuit board 14.

In FIG. 4, the RF screened housing 13 contains a screening plate 15 as well as two mutually opposite side walls 16. When assembled, wall regions 17, which run inwards, engage in the longitudinal direction of the side walls 16 behind the rim of the printed circuit board 14, so that the lower main surface of the printed circuit board 14 can be pressed by elastic means 18a against the wall regions 17, which run inwards, in order to produce an electrical contact between the electrically conductive wall regions 17, which run inwards, and an electrically conductive coating on the lower surface of the printed circuit board 14. The printed circuit board 14 can also, of course, have an electrically conductive coating on its upper side.

The side walls 16 are integrally connected to the screening plate 15 and may, in addition, be provided with a gap 19, which runs transversely with respect to their longitudinal direction and makes it possible for the side walls 16 to be matched to a rim of the printed circuit board 14 which does not run in a straight line, as a result of which it is possible to fix the RF screened housing 13 to the printed circuit board 14 in a relatively large rim region.

Figure 5:
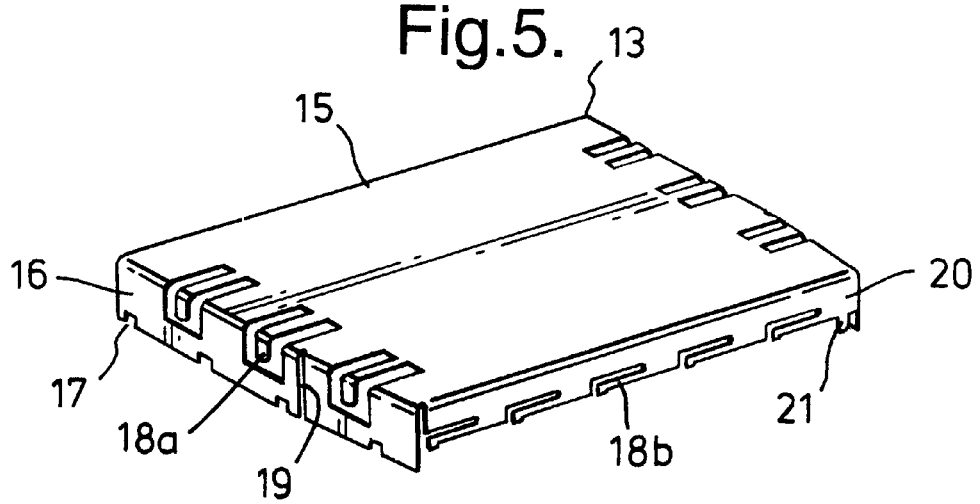
FIG. 5 shows the printed circuit board and the RF screened housing from FIG. 4, separated.
Figure 5:
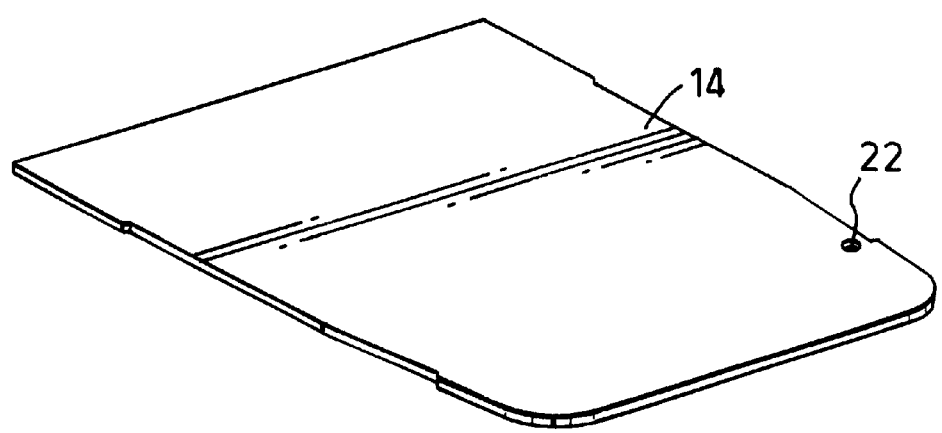

FIG. 5 shows the RF screened housing and the printed circuit board 14, separated. It can be seen that the elastic means 18a are formed by lugs which are composed of parts of the screening plate 15 and of the side walls 16. These lugs are formed by cutting the side wall 16 and the screening plate 15 and by appropriately bending the cut parts inwards. Furthermore, there are sprung tabs 18b at a distance from one another in the longitudinal direction of the side walls 20 which connect the side walls 16. These tabs 18b extend parallel to the side wall 20 and are formed by cutting the side wall 20 horizontally.

The electrically conductive, sprung lugs 18a and the electrically conductive tabs 18b, which are constructed at the free rim of the side walls 20, produce, on the one hand, an additional contact to the electrically conductive coating on the upper main surface of the printed circuit board 14 and, on the other hand, additional contact pressure by the lower main surface of the printed circuit board 14 against the wall regions 17, which run inwards, of the side walls 16.

Furthermore, in FIG. 5, an additional pin 21 is constructed at one corner of the RF screened housing 13, is integrally connected to it, points away from the screening plate 15 in the direction of the printed circuit board 14, and is inserted into a hole 22 in the printed circuit board 14, when the RF screened housing 13 is being fitted onto the printed circuit board 14, in order to prevent the RF screened housing 13 sliding off.

Figure 6:
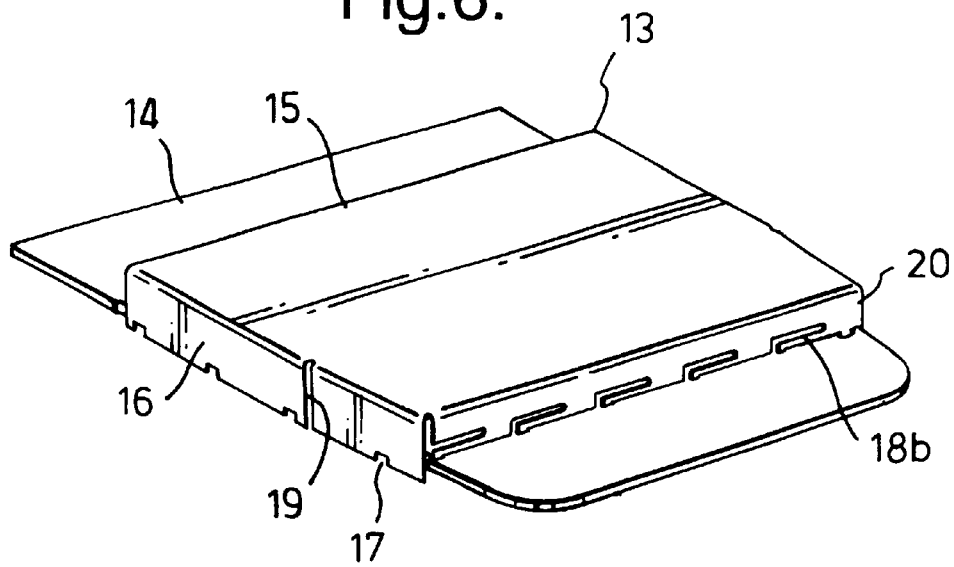
FIG. 6 shows a third exemplary embodiment of an RF screened housing according to the invention, fitted on a printed circuit board.

A third exemplary embodiment of the invention can be seen in FIG. 6, this being very similar to the exemplary embodiment from FIGS. 4 and 5. For this reason, the same reference symbols are used for the same parts as in FIGS. 4 and 5. Furthermore, the corresponding components in the two exemplary embodiments will not be described again.

The difference between the RF screened housing 13 in FIG. 6 and that in FIGS. 4 and 5 is that only the sprung lugs 18b on the free edges of the side walls 20 are used as the elastic means, so that reduced costs are incurred during production and, nevertheless, adequate electrical contact and fixing are produced between the RF screened housing 13 and the printed circuit board 14.

Figure 7:
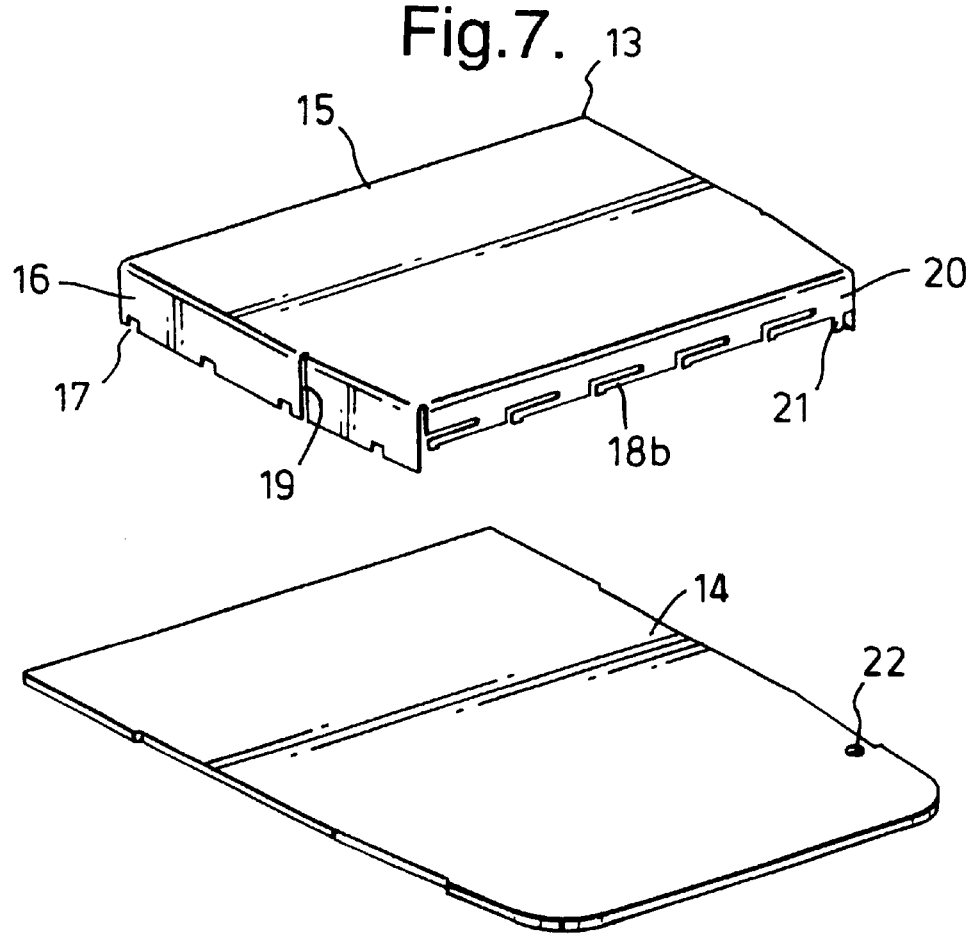
FIG. 7 shows the printed circuit board and the RF screened housing from FIG. 6, separated.

FIG. 7 shows the RF screened housing 13 and the printed circuit board 14, separated.

The RF screened housing according to the invention is suitable, as can be seen from the above statements, in particular for use in units which are subject to stringent reliability requirements with respect to electromagnetic screening. It ensures screening even in the event of severe vibration and can thus also be used, for example, in a vehicle.

Furthermore, the RF screened housing according to the invention is suitable for mass production since it can be manufactured and assembled easily.

The present invention includes any novel feature or combination of features disclosed herein either explicitly or any generalisation thereof irrespective of whether or not it relates to the claimed invention or mitigates any or all of the problems addressed.

In view of the foregoing description it will be evident to a person skilled in the art that various modifications may be made within the scope of the invention.

What is claimed is:

1. Self-securing one piece unitary structure for a RF screened housing having a screening plate and having at least two mutually opposite side walls, which project from the screening plate and are designed to directly engage behind rims of a printed circuit board, which is fitted with the RF screened housing, and having elastic means which can be pressed against at least one of the main surfaces of the printed circuit board in order to elastically and integrally clamp the printed circuit board at the rims to the side walls, the housing and printed circuit board adapted to establish electrical contact therebetween.

2. Self-securing one-piece unitary structure for a RF screened housing according to claim 1, where said side walls have openings, which are located at a distance from one another in the longitudinal direction of said side walls, for holding tabs which project at the sides from the printed circuit board.

3. Self-securing one-piece unitary structure for a RF screened housing according to claim 2, wherein said elastic means are designed as lugs which project into said openings.

4. Self-securing one-piece unitary structure for a RF screened housing according to claim 3, wherein said lugs are bent outwards relative to said side wall.

5. Self-securing one-piece unitary structure for a RF screened housing according to claim 1, wherein said side walls are bent outwards in the region of their free rim.

6. Self-securing one-piece unitary structure for a RF screened housing according to claim 1, wherein said side walls have wall regions which are at a distance from one another in the longitudinal direction of the printed circuit board and run inwards, for engaging behind said rims of said printed circuit board.

7. Self-securing one-piece unitary structure for a RF screened housing according to claim 6, where said wall regions are formed by impressions in places in said side walls.

8. Self-securing one-piece unitary structure for a RF screened housing according to claim 6, wherein said wall regions are formed by cutting and bending said side walls in places.

9. Self-securing one-piece unitary structure for a RF screened housing according to claim 1, wherein said printed circuit board can be pressed by said elastic means away from said screening plate and against those wall regions which run inwards.

10. Self-securing one-piece unitary structure for a RF screened housing according to claim 9, wherein said elastic means are formed by lugs which are composed of parts of said screening plate and/or of said side walls.

11. Self-securing one-piece unitary structure for a RF screened housing according to claim 1, wherein said screening plate has further side walls in the region between the said side walls, on the free edges of which further side walls there are further elastic means for pressing said printed circuit board away from said screening plate.

12. Self-securing one-piece unitary structure for a RF screened housing according to claim 1, wherein said entire unitary structure for a RF screened housing is formed from a single piece of sheet metal.

13. The self-securing one-piece unitary structure for a RF screened housing of claim 1 wherein the rims of the side walls make electrical connection between the RF screened housing and circuitry of the printed circuit board.

14. A RF screened housing adapted to be self-secured to a circuit board without the need for soldering, the housing having a screening plate and at least two mutually opposed side walls, the screening plate and the side walls comprising a one piece unitary structure, the side walls projecting from the screening plate and including portions thereof which engage behind rims of the printed circuit board which is to be fitted with the RF screened housing, the RF screened housing further having elastic means which can be pressed against a main surface of the circuit board in order to clamp the rims of the circuit board circuit board to the RF screened housing and to make electrical connection between the RF screened housing and circuitry of the circuit board.

* * * * *